United States Patent
Makar et al.

(10) Patent No.: US 7,263,642 B1
(45) Date of Patent: Aug. 28, 2007

(54) TESTING REPLICATED SUB-SYSTEMS IN A YIELD-ENHANCING CHIP-TEST ENVIRONMENT USING ON-CHIP COMPARE TO EXPECTED RESULTS FOR PARALLEL SCAN CHAINS TESTING CRITICAL AND REPAIRABLE SECTIONS OF EACH SUB-SYSTEM

(75) Inventors: Samy R. Makar, Fremont, CA (US); Niteen A. Patkar, Burlingame, CA (US)

(73) Assignee: Azul Systems, Inc, Mountain View, CA (US)

( * ) Notice: Subject to any disclaimer, the term of this patent is extended or adjusted under 35 U.S.C. 154(b) by 223 days.

(21) Appl. No.: 11/162,595

(22) Filed: Sep. 15, 2005

(51) Int. Cl.
*G01R 31/28* (2006.01)
*G06F 11/00* (2006.01)

(52) U.S. Cl. ...................... 714/736; 714/742

(58) Field of Classification Search ............... None
See application file for complete search history.

(56) References Cited

U.S. PATENT DOCUMENTS

| | | | |
|---|---|---|---|
| 5,732,209 A | 3/1998 | Vigil et al. ............... | 714/30 |
| 6,122,756 A | 9/2000 | Baxter et al. ............. | 714/30 |
| 6,360,342 B1 | 3/2002 | Lee et al. ................ | 714/718 |
| 6,385,747 B1 | 5/2002 | Scott et al. .............. | 714/724 |
| 6,618,827 B1 | 9/2003 | Benavides ............... | 714/726 |

(Continued)

FOREIGN PATENT DOCUMENTS

JP    2004079032 A  *  3/2004

OTHER PUBLICATIONS

"A Scalable Test Mechanism and Its Optimization for Test Access to Embedded Cores" by He Hu and Sun Yihe This paper appears in: ASIC, 2001. Proceedings. 4th International Conference on Publication Date: 2001 On pp. 773-776 ISBN: 0-7803-6677-8 INSPEC Accession No. 7260840.*

(Continued)

*Primary Examiner*—Cynthia Britt
(74) *Attorney, Agent, or Firm*—g Patent LLC; Stuart T. Auvinen

(57) ABSTRACT

A multi-processor chip has several processor cores that are simultaneously tested in parallel. The processor cores each have identical scan chains that produce identical test results absent defects. Expected test data is scanned from an external tester onto the chip and replicated to each processor core's scan chain. The expected test data is compared to scan chain outputs at each processor core. Any mismatches set a test-fail bit for that processor core. Each processor core has repairable scan chains and a separate critical scan chain. Failures in the critical scan chain in any processor core cause the whole chip to fail. Processor cores are disabled that have failures in their repairable scan chains, allowing the chip to be repairable by using the remaining processor cores. Critical scan chains include logic that drives to other blocks on the chip, while repairable scan chains have logic embedded deep within a processor core.

22 Claims, 9 Drawing Sheets

U.S. PATENT DOCUMENTS

| | | | |
|---|---|---|---|
| 6,966,018 B2 * | 11/2005 | Hilliges | 714/724 |
| 7,155,637 B2 * | 12/2006 | Jarboe et al. | 714/8 |
| 2002/0170009 A1 | 11/2002 | Barnhart | 714/726 |
| 2002/0199143 A1 | 12/2002 | Alt et al. | 714/726 |
| 2003/0200492 A1 | 10/2003 | Nakao et al. | 714/724 |
| 2003/0204802 A1 | 10/2003 | Sim | 714/726 |
| 2005/0204217 A1 * | 9/2005 | Whetsel et al. | 714/724 |

OTHER PUBLICATIONS

"Addressable Test Ports an Approach to Testing Embedded Cores" by Whetsel, L. This paper appears in: Test Conference, 1999. Proceedings. International Publication Date: 1999 On pp. 1055-1064 ISBN: 0-7803-5753-1 INSPEC Accession No. 6543625.*

* cited by examiner

TESTING REPLICATED SUB-SYSTEMS IN A YIELD-ENHANCING CHIP-TEST ENVIRONMENT USING ON-CHIP COMPARE TO EXPECTED RESULTS FOR PARALLEL SCAN CHAINS TESTING CRITICAL AND REPAIRABLE SECTIONS OF EACH SUB-SYSTEM

FIELD OF THE INVENTION

This invention relates to testing very-large-scale-integration (VLSI) systems, and more particularly for methods for testing redundant blocks with test scan chains.

BACKGROUND OF THE INVENTION

Semiconductor processing improvements and sophisticated design tools have allowed for more and more functions to be integrated together on a single integrated circuit (IC) chip. Such improvements allowed for cache memories to be integrated onto the same chip as a central processing unit (CPU) core. More recently, multiple CPU cores are being integrated onto the same chip along with one or more memories. As this trend continues, multiple CPU cores and multiple memory blocks will be integrated together.

FIG. 1 shows a multi-processor system chip. Processor cores 10, 10', 10" are integrated together onto IC chip 20. Each processor core may execute a separate stream of instructions and each accesses its own local cache memory, caches 12, 12', 12". When data is not found in the local cache memory (a cache miss), memory controllers 14, 14', 14" fetch the desired data from an external memory, such as using an external bus to a large external main memory.

Snoop tags 16 contain directory information about the entries currently being stored in caches 12, 12', 12". Cache coherency is achieved through the use of snoop tags 16, perhaps in conjunction with external directories and other controllers.

Self-test logic and test controllers may also be integrated onto a very-large-scale-integration (VLSI) chip. Test controller 18 may be included on IC chip 20. Test controller 18 may be activated by a combination or sequence of signals on external pins that activates a test mode.

FIG. 2 shows prior-art test scan chains in a large chip. Test scan chains are often inserted into chips to aid automated testing. Special chip-design software can replace ordinary D-type flip-flops with testable or scan flip-flops 30 that have two D inputs and 2 clocks. The extra clock inputs to scan flip-flops 30 are driven by test clock TCK, which can be applied to an external pin of the chip and may be buffered or gated (not shown). The normal clocks are stopped during test mode and TCK is pulsed to scan in and out data along the scan chains. The extra D inputs to scan flip-flops 30 are connected to Q outputs of other scan flip-flops 30 to form a scan chain along scan flip-flops 30.

The first scan flip-flops 30 in the scan chain has a second D input that receives a test-input TI from an external pin, while the last Q output from the last scan flip-flop of the chain of scan flip-flops 30 drives a test output TO that can be read by an external tester and compared to expected data by the external tester.

When a large chip has multiple CPU blocks 22, 22', 22", the Q output of the last scan flip-flop 30 in one CPU block 22 can drive the D test input of the first scan flip-flop 30 in second CPU block 22'. Likewise, the Q output of the last scan flip-flop 30 in second CPU block 22' can drive the D test input of the first scan flip-flop 30 in third CPU block 22". Thus test scan chains of scan flip-flops 30 in CPU blocks 22, 22', 22" may be chained together into one long scan chain.

While useful, the length of the long scan chain of scan flip-flops 30 through many CPU blocks 22, 22', 22" can be excessively long, requiring many pulses of test clock TCK to scan data in and out. Testing may be inefficient, increasing test times and test costs. Isolating test failures to particular CPU blocks may be quite difficult since the scan chains from different blocks are strung together into one long scan chain. The tester log file may have to be examined to determine which of CPU blocks 22, 22', 22" caused the test failure.

Further, when one of CPU blocks 22, 22', 22" has a defect that causes the CPU block to fail, the scan chain may be faulty too. A defect within the scan chain, although occurring in only one of CPU blocks 22, 22', 22", may prevent testing of other CPU blocks 22, 22', 22". Thus the entire chip fails when a single defect in one of CPU blocks 22, 22', 22" occurs that blocks the scan chain to other CPU blocks 22, 22', 22".

CPU blocks 22, 22', 22" could have separate scan chains, but then multiple test outputs TO would be generated from the multiple CPU blocks 22, 22', 22". Many chip pins might be needed for the multiple TO test outputs, and the external tester would have to compare expected data to the actual data from the many TO pins.

What is desired is test logic for a more complex multi-processor chip. An on-chip test system that can test multiple CPU cores independently of one another is desirable. Test scan chains and test controllers that can test multiple CPU cores in parallel is desirable. Test scan chains that can isolate faults in redundant processor cores are also desirable.

DETAILED DESCRIPTION

The present invention relates to an improvement in redundant-block test scan chains. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
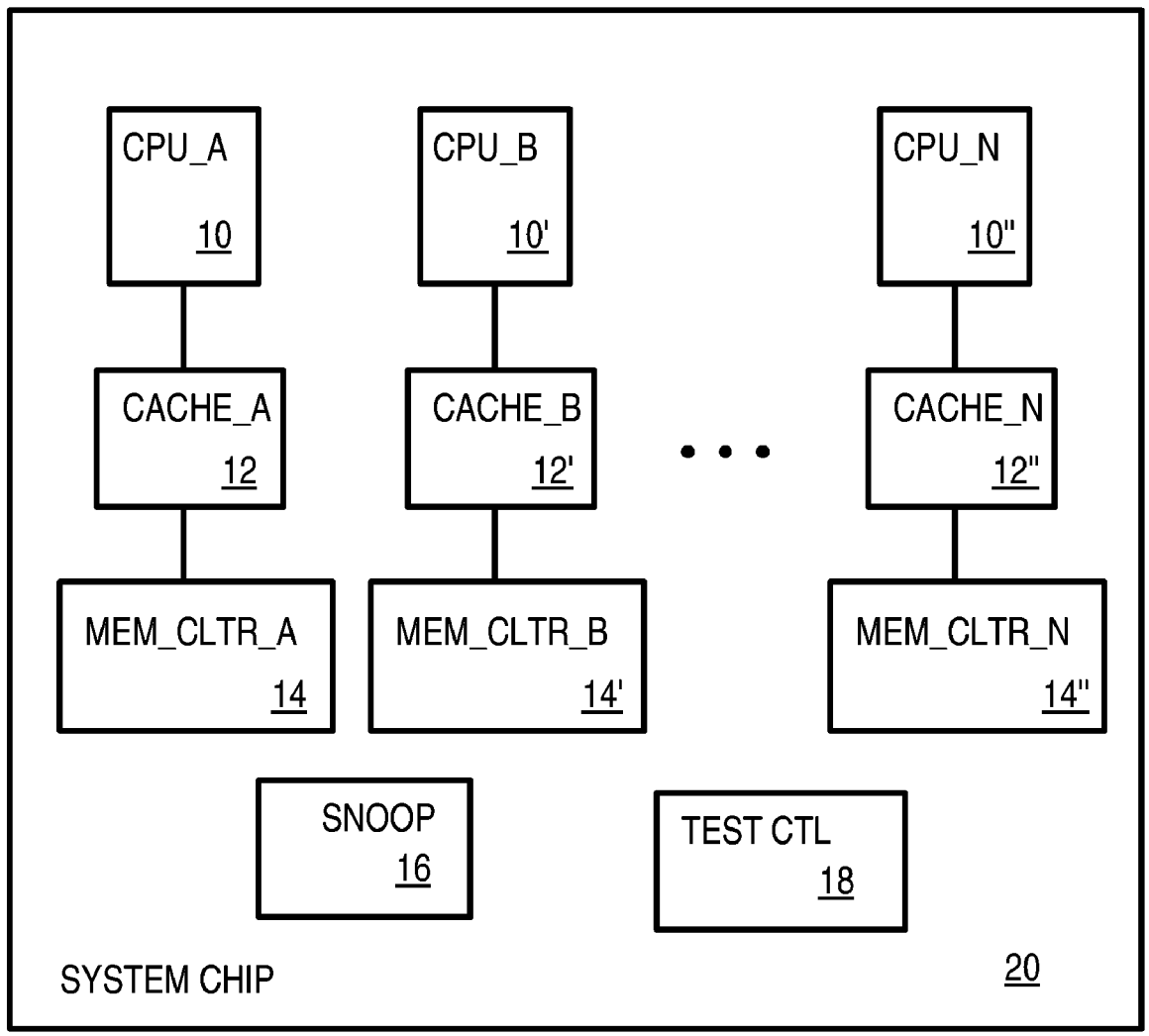
FIG. 1 shows a multi-processor system chip.
Figure 2:
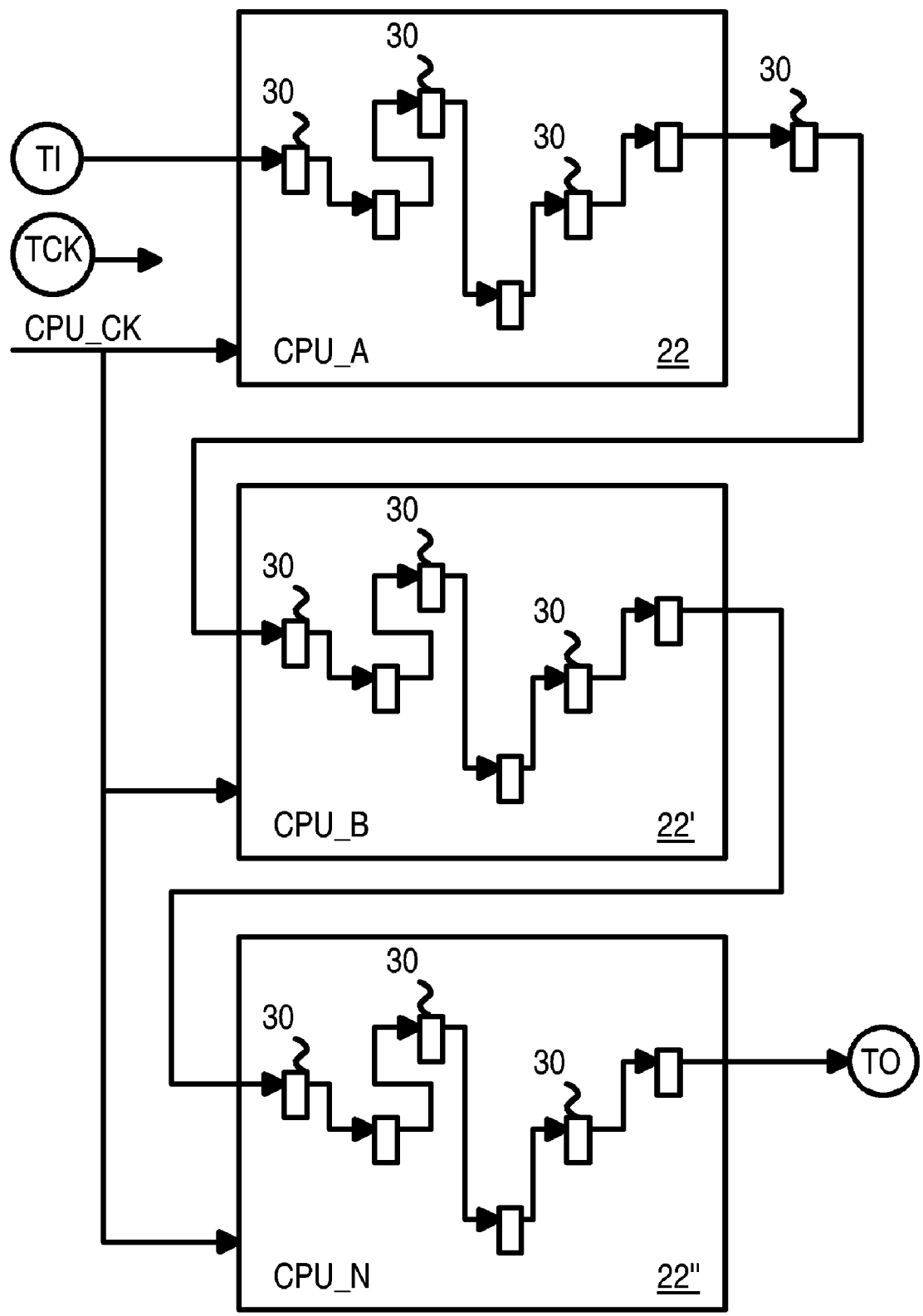
FIG. 2 shows prior-art test scan chains in a large chip.
Figure 3:
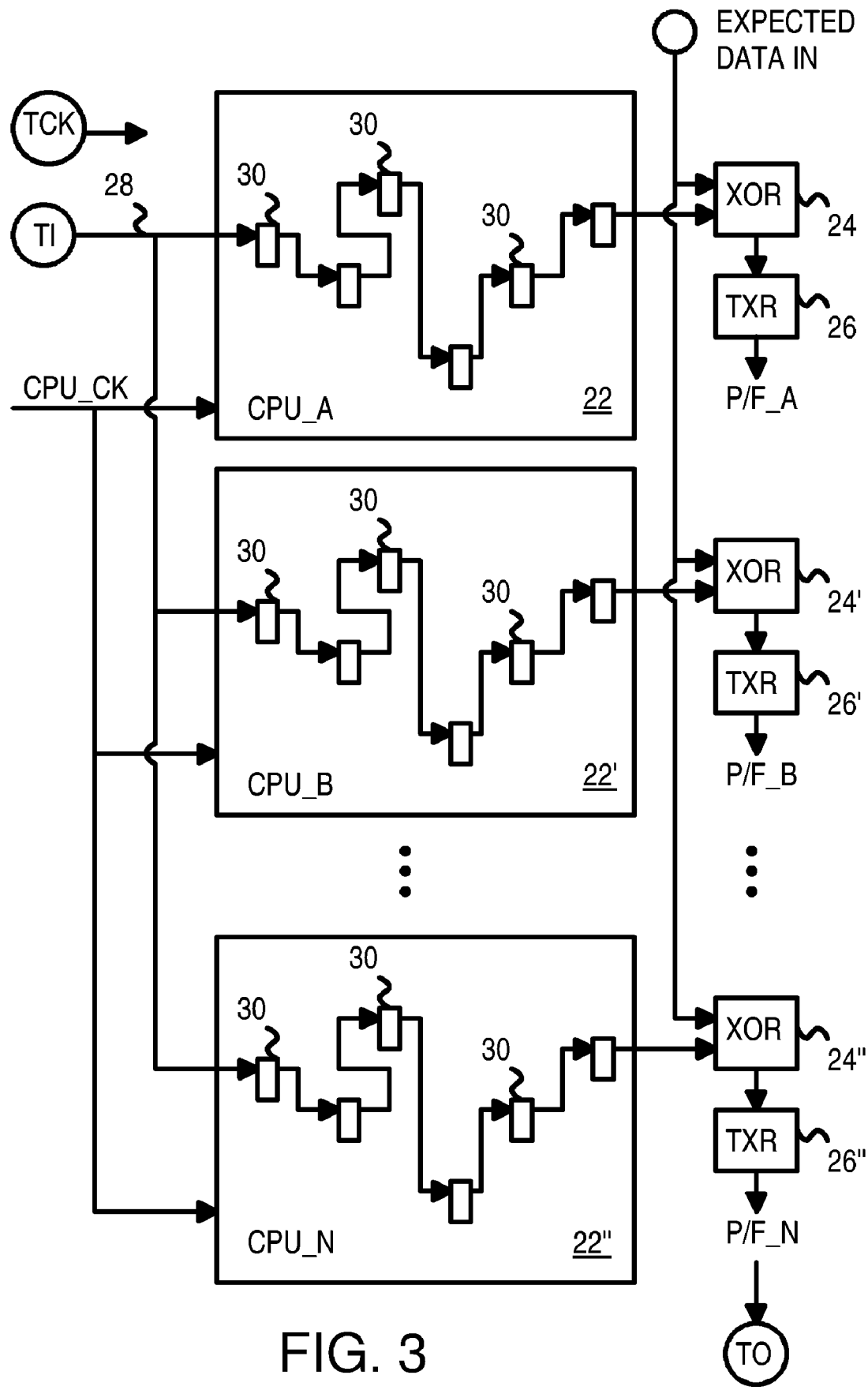
FIG. 3 is a block diagram of parallel scan chains that test redundant blocks in parallel and compare expected results on-chip.

FIG. 3 is a block diagram of parallel scan chains that test redundant blocks in parallel and compare expected results on-chip. CPU blocks 22, 22', 22" are processor core blocks that can be identical or nearly identical for testing purposes. Each of CPU blocks 22, 22', 22" has a scan chain of scan flip-flops 30 that test the same logic blocks and functions in each of CPU blocks 22, 22', 22".

The first of scan flip-flops 30 in each of CPU blocks 22, 22', 22" receives test scan-in data from test input line 28, which is driven by test-input pin TI, perhaps with some buffering or switching logic (not shown). Since test input line 28 drives the first test input of scan flip-flops 30 in each of CPU blocks 22, 22', 22", the same test data is scanned into all of CPU blocks 22, 22', 22" in parallel, at the same time, from test input line 28.

Each of CPU blocks 22, 22', 22" receives a test clock that can be the same signal or derived from the same base clock signal such as input TCK. Likewise, all of CPU blocks 22, 22', 22" receive a normal CPU clock that is pulsed for normal operation. Various buffering or power management control (not shown) may be applied to the CPU clocks to disable the CPU clock for disabled or unused CPU blocks 22, 22', 22".

Since scan chains of scan flip-flops 30 are connected to identical logic in each of CPU blocks 22, 22', 22", and receive the same test data scanned in from test input line 28, the test outputs from the end of each scan chain should have identical test data when there are not faults in CPU blocks 22, 22', 22".

While the test results from each scan chain could be output from the chip and externally compared by an external tester, the inventors have realized that a further efficiency can be created by scanning the expected data from the external tester onto the chip and comparing on-chip. The expected data from the external tester is input to the chip and routed to multiple exclusive-OR XOR gates 24, 24', 24". Each of XOR gates 24, 24', 24" also receives the test data scanned out of the last Q output of scan flip-flops 30 in one of CPU blocks 22, 22', 22".

For example, XOR gate 24 receives the test data from the scan chain in CPU block 22, and compares it to the expected test data from the external tester. When the actual test data from CPU block 22 mis-matches the expected test data, XOR gate 25 drives a high signal to test-capture register 26, which latches in a failure. When the test data scanned out of CPU block 22 matches the expected test data, XOR gate 24 outputs a low to test-capture register 26, which retains it's previous state. If no mis-matches occur, then the output of XOR gate 24 never goes high and test-capture register 26 remains low, indicating that CPU block 22 has passed the test.

All CPU blocks 22, 22', 22" may be tested in parallel, receiving the same test data scanned in from test input line 28 with each pulse of test clock TCK, and comparing the test data scanned out of the last of scan flip-flops 30 in the CPU block to expected data from the external tester. XOR gates 24, 24', 24" compare, in parallel, the expected data to the actual test data scanned out from all of CPU blocks 22, 22', 22", and any mis-matches cause a 1 to be latched into test-capture registers 26, 26', 26" for the failing one of CPU blocks 22, 22', 22". Expected data from the external tester, and the data scanned out of scan flip-flops 30 can be updated with each pulse of test clock TCLK.

The CPU clock may be pulsed one or more times between each pulse of the test clock TCK. This allows sequential logic and functions to be tested more thoroughly in each of CPU blocks 22, 22', 22". The scan chains of scan flip-flops 30 may be initially loaded and tested by pulsing only TCK for many cycles and not pulsing the CPU clock. A variety of sequences and combinations may be used.

Upon the conclusion of one or more test sequences, test-capture registers 26, 26', 26" are still zero for CPU blocks 22, 22', 22" that had no mis-matches, and thus have passed the test sequence, while test-capture registers 26, 26', 26" contain a one for any of CPU blocks 22, 22', 22" that had a mis-match with the expected data. The state of each of test-capture registers 26, 26', 26" may be routed to a test-out pin TO, allowing an external tester to read the states of test-capture registers 26, 26', 26".

The external tester, or an internal test controller, may read each of test-capture registers 26, 26', 26" to read the test outcomes. When a failure is detected, the one of CPU blocks 22, 22', 22" that caused the failure may be disabled. The other, non-failing CPU blocks 22, 22', 22" may continue to be tested, or may be used for normal operations. Thus failing CPU blocks can be identified and disabled, allowing the chip to be used with the remaining CPU blocks. The failing CPU blocks may be permanently disabled such as by writing a failure code to a flash or other programmable memory on the chip, or by blowing a fuse on the chip such as with a laser or with high current. The chip could also be sold with the failure code or other indication of failing cores, with instructions on how to have software disable the failing CPU cores.

Figure 4:
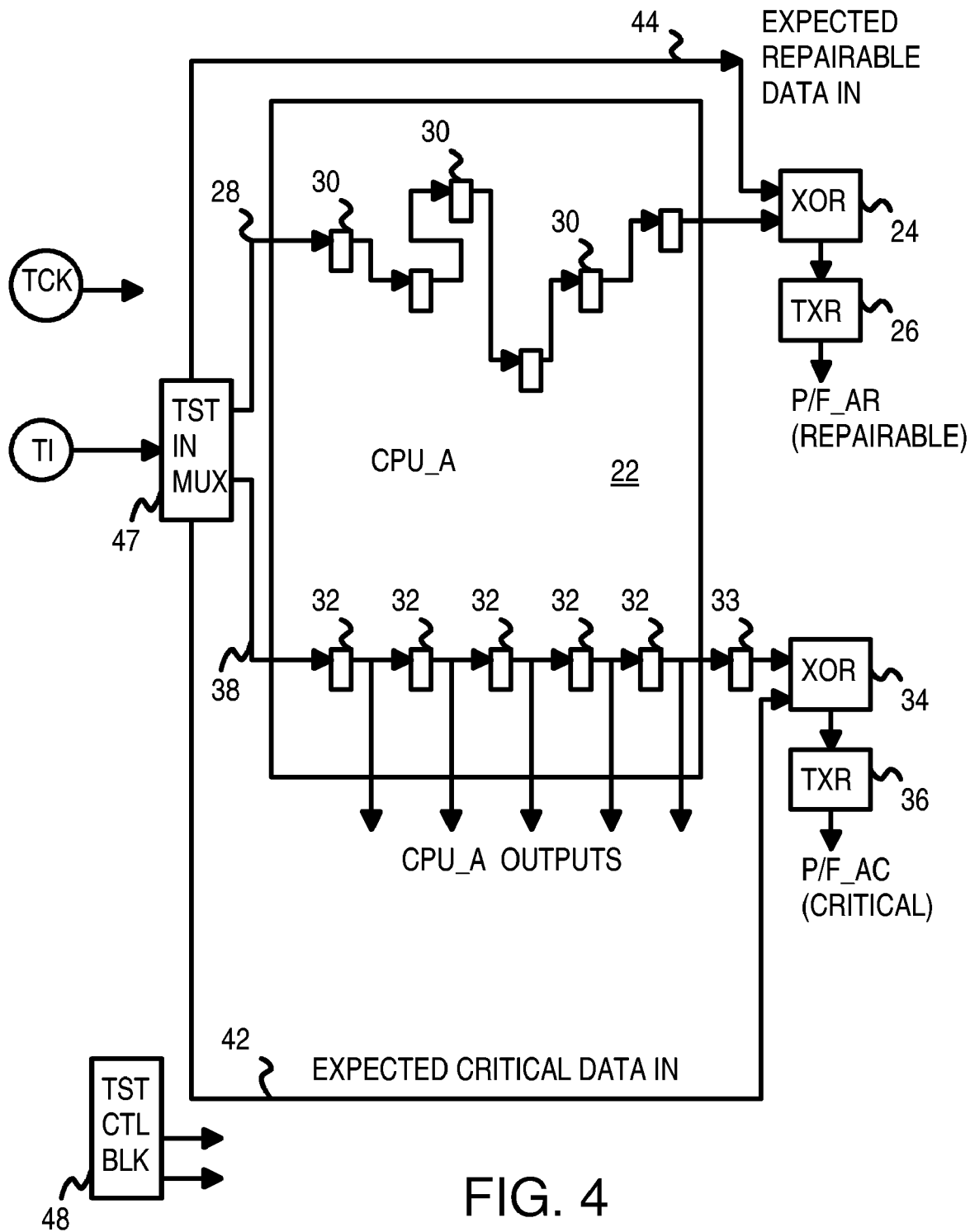
FIG. 4 shows separate scan chains for repairable and critical logic in a processor core block.

FIG. 4 shows separate scan chains for repairable and critical logic in a processor core block. Each of CPU blocks 22, 22', 22" may be a large block with thousands, 100,000, or even millions of transistors. When a defect occurs deep with a CPU block, the failure might not affect other CPU blocks. This defect is "repairable" since the defect can be masked by disabling the CPU block. The other CPU blocks can still operate since the defect is buried deep within the disabled CPU block.

Some defects may occur near the logical edges of a CPU block, such as in interface logic to buses, shared memories, controllers, or an interface to other CPU blocks. When these edge defects occur, the defect may affect other blocks, preventing the other blocks from operating properly. For example, a defect in a buffer that drives a memory bus could prevent other CPU blocks from using that memory bus. If that is the only memory bus that the other CPU blocks can use, then the whole chip may fail. None of the CPU's could access memories. The defect is known as a "critical" defect since disabling the CPU block with the critical defect still causes other CPU blocks to fail.

CPU block 22 is one of many CPU blocks on a multi-processor chip. Logic deep within CPU block 22 is tested by scan flip-flops 30, which form a "repairable" scan chain. Since logic around scan flip-flops 30 is deep within CPU block 22, any failures might not propagate outside of CPU block 22 when CPU block 22 is disabled. Thus the chip might be repaired.

Logic on the periphery of CPU block 22 may propagate to other CPU blocks, even when CPU block 22 is disabled. Thus defects in this area are critical. Critical scan flip-flops 32 form a critical scan chain. Defects found by critical scan flip-flops 32 may cause the entire chip to fail. Critical scan flip-flops 32 may generate outputs from CPU block 22 to other blocks, or be near these outputs.

Test data is scanned into scan flip-flops 30 over test input line 28, and is scanned out to XOR gate 24. XOR gate 24 also receives expected test data for the repairable test chain of scan flip-flops 30 from repairable expected data line 44. Comparisons can be made on a cycle-by-cycle basis for each test-clock period as test data is scanned in and out of the scan chains. When a mis-match is detected by XOR gate 24, a high is latched into test-capture register 26. Test control block 48 can later read the state of test-capture register 26 to determine that a repairable failure has occurred in CPU block 22.

Test data is also scanned into critical scan flip-flops 32 over critical test input line 38, and is scanned out to XOR gate 34. XOR gate 34 also receives expected test data for the critical test chain of critical scan flip-flops 32 from critical expected data line 42. When a mis-match is detected by XOR gate 34, a high is latched into test-capture register 36. Test control block 48 can later read the state of test-capture register 36 to determine that a critical failure has occurred in CPU block 22.

The critical scan chain may include scan flip-flop 33 that does not drive an output of CPU block 22, but is still in the critical chain. Some non-critical logic may by tested by scan flip-flop 33 that is included with the critical test chain for physical layout efficiency or other reasons.

Test-input data could arrive on-chip from multiple test-input pins, or could be de-multiplexed from a single test-input TI pin by test input de-multiplexer 47. Scan chain test inputs are routed to test input line 28 and critical test input line 38 by test input de-multiplexer 47, while expected data is routed to XOR gates 24, 34 over repairable expected data line 44, critical expected data line 42. A higher-speed clock (not shown) than test clock TCK could be used to clock in data on pin TI, and then route the data from test input de-multiplexer 47 to all four of lines 28, 38, 42, 44 before the next edge of test clock TCK. Test control block 48 could also allow just one scan chain to be tested at a time, such as scan flip-flops 30 first, ignoring the output of XOR gate 34, and then test critical scan flip-flops 32 while ignoring the output of XOR gate 24. Test-capture registers 26, 36 may be held reset when their scan chains are not being tested.

Figure 5:
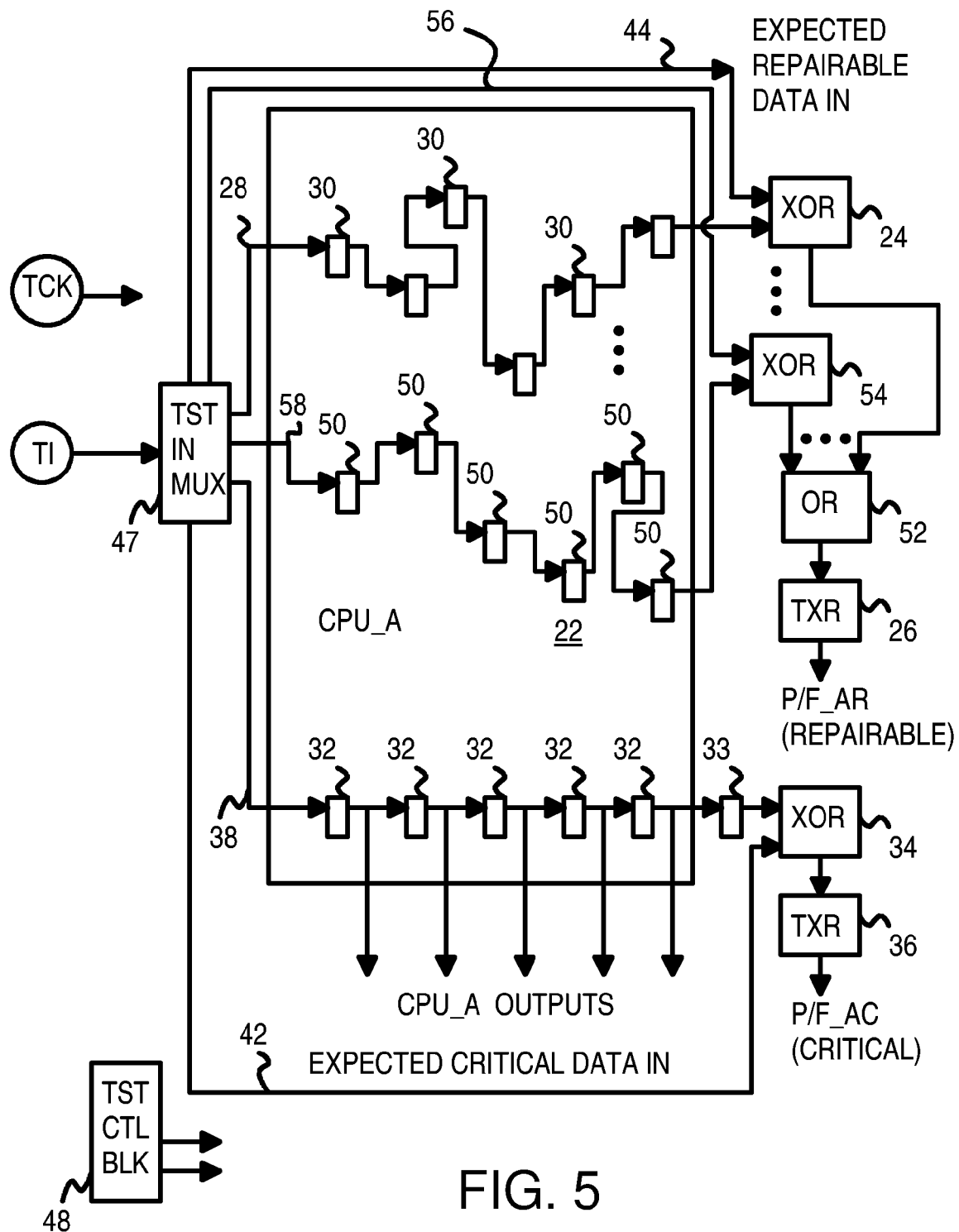
FIG. 5 shows multiple scan chains for repairable and critical logic in a processor core block.

FIG. 5 shows multiple scan chains for repairable and critical logic in a processor core block. Rather than have one long repairable scan chain, several repairable scan chains may be used in parallel on the same CPU block.

Test input line 28 from test input de-multiplexer 47 drives test data input to a first repairable scan chain of scan flip-flops 30, while second test input line 58 from test input de-multiplexer 47 drives test data input to a second repairable scan chain of scan flip-flops 50. The last Q output of scan flip-flops 30 drives XOR gate 24, which compares the scan-out data to repairable expected data line 44 and latches a one into test-capture register 26 if a mis-match occurs. Likewise, the last Q output of scan flip-flops 50 drives XOR gate 54, which compares the scan-out data from the second scan chain to second repairable expected data line 56 and latches a one into test-capture register 26 if a mis-match occurs.

OR gate 52 OR's all outputs from XOR gates 24, 52 so that a mis-match (one) from any XOR gate gets latched into test-capture register 26. There may be more than two repairable scan chains that are compared to expected data and have mis-match results combined by OR gate 52. Thus test-capture register 26 is set high if any mis-match occurs in any of the repairable scan chains OR'ed together by OR gate 52. A single pass/fail result may be read for all repairable scan chains in CPU block 22.

Test data is also scanned into critical scan flip-flops 32 over critical test input line 38, and is scanned out to XOR gate 34. XOR gate 34 also receives expected test data for the critical test chain of critical scan flip-flops 32 from critical expected data line 42. When a mis-match is detected by XOR gate 34, a high is latched into test-capture register 36. Test control block 48 can later read the state of test-capture register 36 to determine that a critical failure has occurred in CPU block 22.

Since a single test-capture register 26 stores the results for all repairable scan chains, only one register needs to be read to determine if a reparable defect was detected for CPU block 22. Also, since separate test results are stored in test-capture registers 26, 36 for repairable scan chains and for critical scan chains, a critical, non-repairable error is reportable by reading one register per CPU block, test-capture register 36.

Each CPU block can have a pair of repairable and critical test-capture registers 26, 36. Test software can quickly determine which CPU blocks had errors, and whether the chip is repairable, by reading two register bits per CPU. These bits could be accessible as part of a same 8-bit or 32-bit register, or in a longer scanable register, reducing external access cycles needed.

Figure 6:
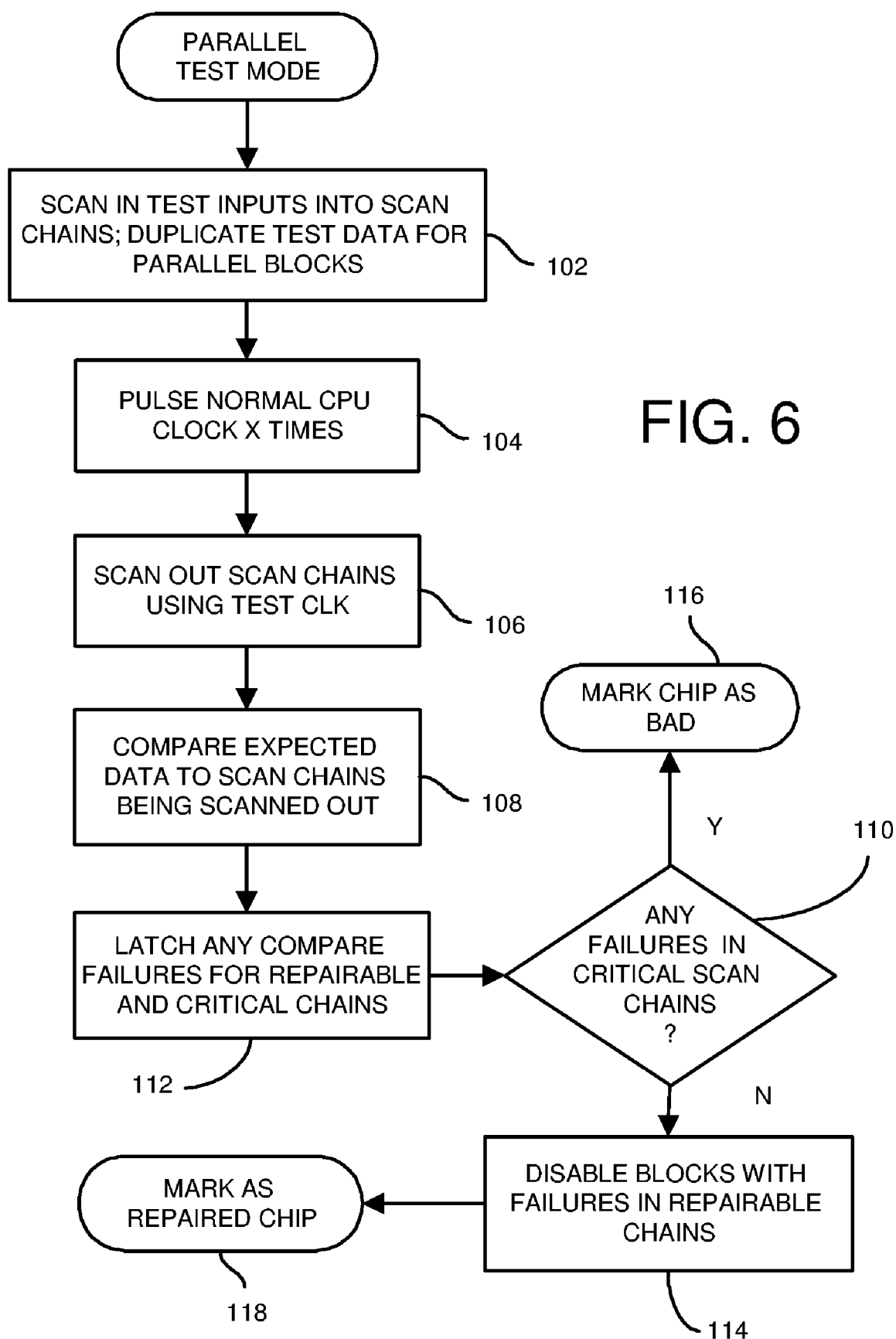
FIG. 6 is a flowchart of parallel testing of a multi-processor chip using critical and repairable scan chains.

FIG. 6 is a flowchart of parallel testing of a multi-processor chip using critical and repairable scan chains. The test mode is activated, such as by a combination of signals on the chip's input pins that does not occur or is illegal during normal operation. The test data to load into the scan flip-flops is loaded onto one or more chip pins and clocked though the scan chains using the test clock, step 102. The same test data is internally replicated and driven to multiple scan chains for multiple blocks such as CPU blocks. After some number of test clock pulses to fill a desired number of flip-flops in the scan chains, the test clock is paused and the CPU clock is pulsed some number X of times, step 104. The data that was scanned into the scan flip-flops acts as internal input data within each CPU block, and the CPU sequences for one or more CPU clock cycles, generating new data that is loaded into the scan flip-flops by the pulsing of the CPU clock. Thus pulsing the CPU clock has altered the data in the scan flip-flops.

The altered data in the scan flip-flops is scanned out by pulsing the test clock while the CPU clock is stopped, step 106. Expected data from the external tester is input to the chip and internally routed and replicated to many XOR gates that compare the expected data to the data being scanned out of the scan flip-flops, step 108. New expected data can be entered for each test-clock period. Since the multiple CPU blocks are identical and have identical scan chains and logic, the data being scanned out of the multiple blocks should be the same for all blocks, and should match the expected data.

When the expected data from the external tester does not match the data being scanned out of a CPU block, the XOR gate for that faulty CPU block drives a one to a test-capture register for that block, which latches in the one, step 112. Separate XOR compares and test-capture registers may be provided for each CPU block, and for repairable and critical scan chains within each CPU block.

Steps 102 to 112 may be repeated many times before checking the pass/fail status from the test-capture registers. Alternately, the pass/fail status may be checked periodically, or even each time the scan chains are checked, as shown in FIG. 6. More frequent pass/fail checking allows the test to stop as soon as an error is detected. The test-capture registers may be cleared or reset before each test sequence, or after the test-capture registers are checked or read by the test program.

After a test sequence is finished, the test controller or external tester reads the critical test-capture registers for all CPU blocks. When any test-capture registers are set for a critical scan chain, step 110, the defect is considered unrepairable. The un-packaged chip or die on the wafer is marked as bad, step 116, or discarded if already packaged.

When none of the critical test-capture registers are set, step 110, then the test program reads all the repairable test-capture registers. Any CPU block that has its repairable test-capture register set has a fault that can allow the chip to function when the CPU block is disabled. The test program disables all CPU blocks that have their repairable test-capture register set, step 114. The remaining CPU blocks do not have any detected faults. The chip may be tested further, and the chip or die sorted or marked as a good die, step 118, assuming any additional tests are passed.

Although some of the CPU blocks may be disabled, the repaired chip may still be useful. The repaired chip may be a downgraded part with fewer processors that a fully good chip. For example, a chip without any defects may have 16 processor cores, while a repaired chip may have only 8 processors, or perhaps 4 or 2 processors. Some good CPU blocks may be disabled along with the faulty CPU blocks so that the desired number of processor cores are enabled, such as a power of 2. For example, when a 16-processor chip has 5 repairable (bad) CPU blocks, these 5 CPU blocks are disabled. Another 3 good CPU blocks are also disabled so that the total number of CPU blocks is a power of two (8 CPU blocks).

Since all CPU blocks may be tested in parallel, tester time can be significantly reduced. Critical failures may be quickly detected in any of the many CPU blocks. Testing the CPU blocks sequentially, one at a time, would be much slower.

Figure 7:
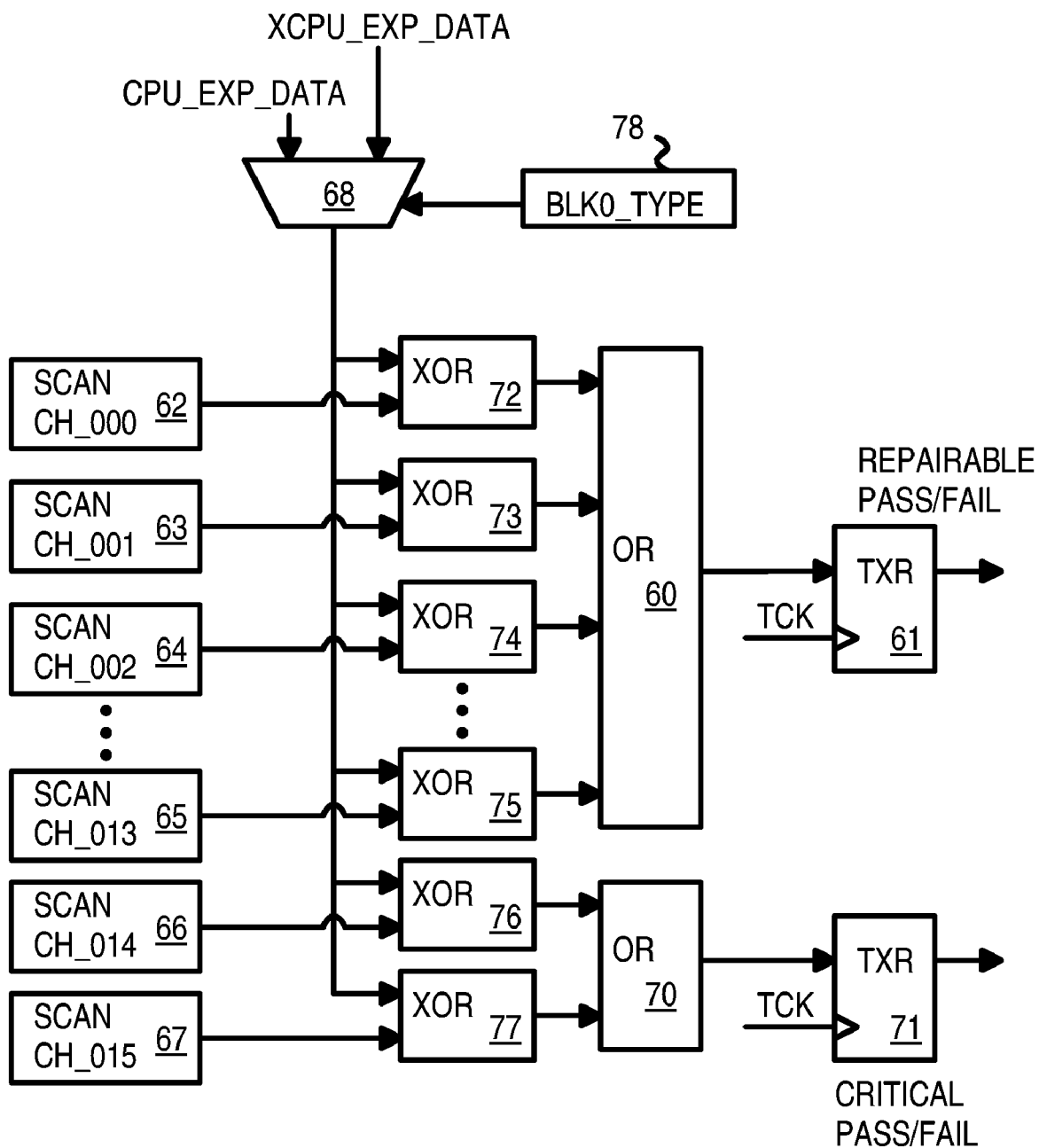
FIG. 7 is a diagram of test verification hardware for use with two different kinds of CPU blocks.

FIG. 7 is a diagram of test verification hardware for use with two different kinds of CPU blocks. All CPU blocks may be exactly identical, or may be functionally identical but physically different due to layout constraints on the chip. Since the scan chain may be ordered based on the physical locations of the flip-flops within the block, the scan chains may be completely different in the physical net-lists.

Two sets of expected data may be scanned into the chip from the external tester. CPU_EXP_DATA is the expected data for testing regular CPU blocks, while XCPU_EXP_DATA is the expected data for testing extended CPU blocks. The type of CPU block, regular or extended, is stored as one of the bits in block-type register 78. Mux 68 selects the regular expected data, CPU_EXP_DATA, when the block-type bit in block-type register 78 is low, but selects extended expected data, XCPU_EXP_DATA, when the block-type bit in block-type register 78 is high.

The selected expected data is fed from mux 68 to one of the inputs to XOR gates 72-77. The expected data, and mux 68, may be multiple bits in width, so that each of XOR gates 72-77 receives different expected data.

In this example, the CPU block has 16 scan chains 62-67, labeled CH_000, CH_001, . . . CH_015 for CPU_BLK_0. CPU_BLK_5 could have another 16 scan chains labeled CH_500, CH_501, . . . CH_515. The first 14 scan chains 62-65 are repairable scan chains while the last 2 scan chains 66, 67 are critical scan chains.

The Q outputs from the last flip-flops in the last 2 critical scan chains 66, 67 are fed to XOR gates 76, 77 and compared to the last 2 expected data bits from mux 68 for the current test-clock period. The expected data typically changes for each test-clock period as test data is shifted out of the scan chains. If either of scan chains 66, 67 has a failure, one of XOR gates 76, 77 outputs a high to OR gate 70, which outputs a high to critical test-capture register 71. This sets critical test-capture register 71, locking in a high. When neither of scan chains 66, 67 has a failure, XOR gates 76, 77 output lows to OR gate 70, which outputs a low to critical test-capture register 71, allowing critical test-capture register 71 to remain in its last state. Thus the first failure detected by XOR gates 76, 77 locks in a one into critical test-capture register 71. When critical test-capture register 71 is read at the end of a test sequence, a low indicates that the CPU block passed the critical tests, while a one indicates that at least one failure was detected.

The Q outputs from the last flip-flops in the first 14 repairable scan chains 62-65 are fed to XOR gates 72-75 and compared to the first 14 expected data bits from mux 68 for the current test-clock period. If any of repairable scan chains 62-65 has a failure, one of XOR gates 72-75 outputs a high to OR gate 60, which outputs a high to repairable test-capture register 61. This sets repairable test-capture register 61, locking in a high. When none of scan chains 62-65 has a failure, XOR gates 72-75 output lows to OR gate 60, which outputs a low to repairable test-capture register 61, allowing repairable test-capture register 61 to remain in its last state. The first failure detected by XOR gates 72-75 locks in a one into repairable test-capture register 61. When repairable test-capture register 61 is read at the end of a test sequence, a low indicates that the CPU block passed the repairable tests, while a one indicates that at least one repairable failure was detected.

Overall yields may be increased, since repairable die may be sold as downgraded parts. Also, extra CPU cores may be included beyond the intended number of CPU cores in a final product. For example, the die can have 9 CPU cores when the final product is sold as an 8-CPU-core chip.

Figure 8:
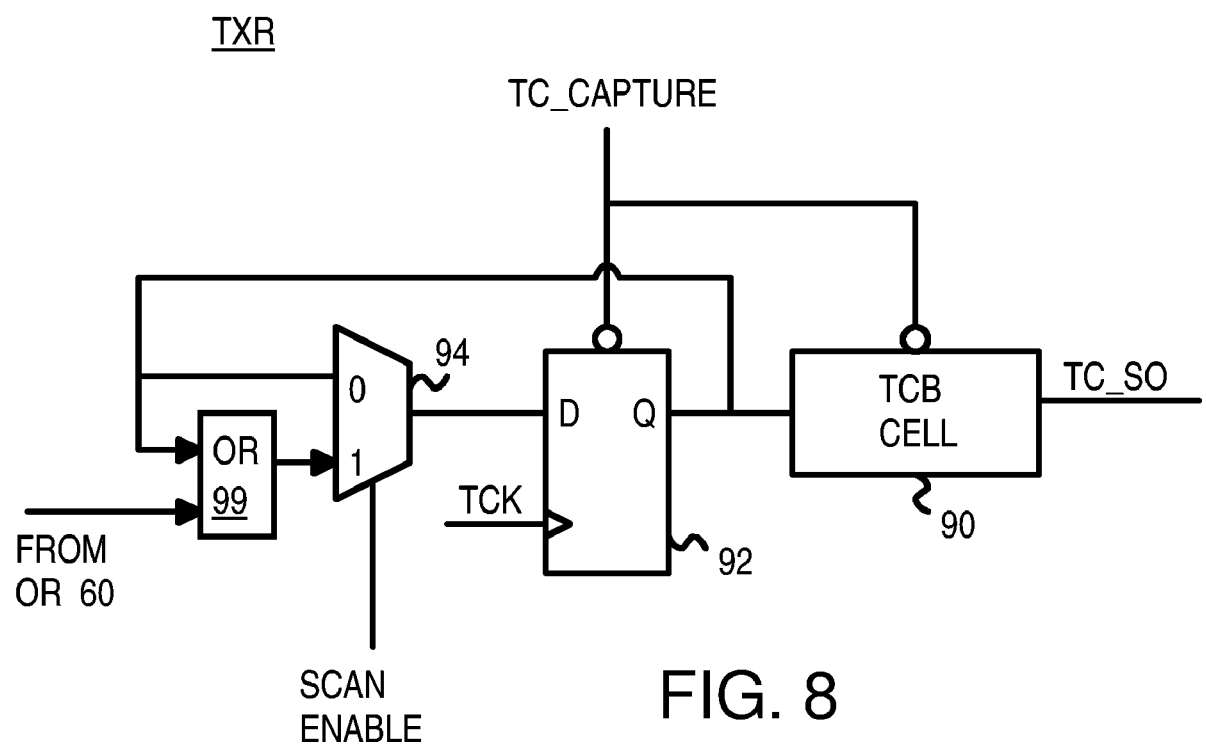
FIG. 8 shows a test-capture register in more detail.

FIG. 8 shows a test-capture register in more detail. Test-capture registers lock into a set state after any mismatch is detected in one of the XOR gates that are OR'ed together. After test data is scanned into the scan flip-flops, but before valid comparisons are made of the shift outputs from the scan chains, TC_Capture is pulsed high to reset flip-flop 92 and TCB cell 90. Scan enable is driven high when the scan chain is shifting to enable mux 94 to sum test compare results.

When no mis-matches are detected by XOR gates, the output of OR gate 60 (FIG. 7) remains low. The low Q output from flip-flop 92 is recirculated back to its D input through OR gate 99 and mux 94. After application of the test is completed, TC_CAPTURE is asserted for one cycle, copying the result into TCB cell 90, and clearing flip-flop 92, getting it ready for the application of another test.

TCB cell 90 may be read after the test sequence is completed. Scan enable is driven low to block further inputs from OR gate 60 at mux 94. TCB cell 90 may be in a chain of test-control-block cells that are scanned out and read by the external tester when reading test results.

When a defect causes a mis-match that is detected by an XOR gate, the output of OR gate 60 (FIG. 7) goes high for one test-clock period. OR gate 99 and mux 94 pass this high through to the D input of flip-flop 92. Flip-flop 92 is clocked to a high state on the next test-clock rising edge, causing the Q output to go high.

The high Q output from flip-flop 92 is recirculated back to its D input through OR gate 99 and mux 94. This recirculation locks in the high into flip-flop 92. TCB cell 90 copies the high from the Q output of flip-flop 92. An external tester reading TCB cell 90 detects that the test failed by the high bit in TCB cell 90.

The test-capture registers, including flip-flop 92 and TCB cell 90, may be cleared or reset before each test sequence, such as after the test data has been initially scanned into all the scan flip-flops in the scan chain.

Figure 9:
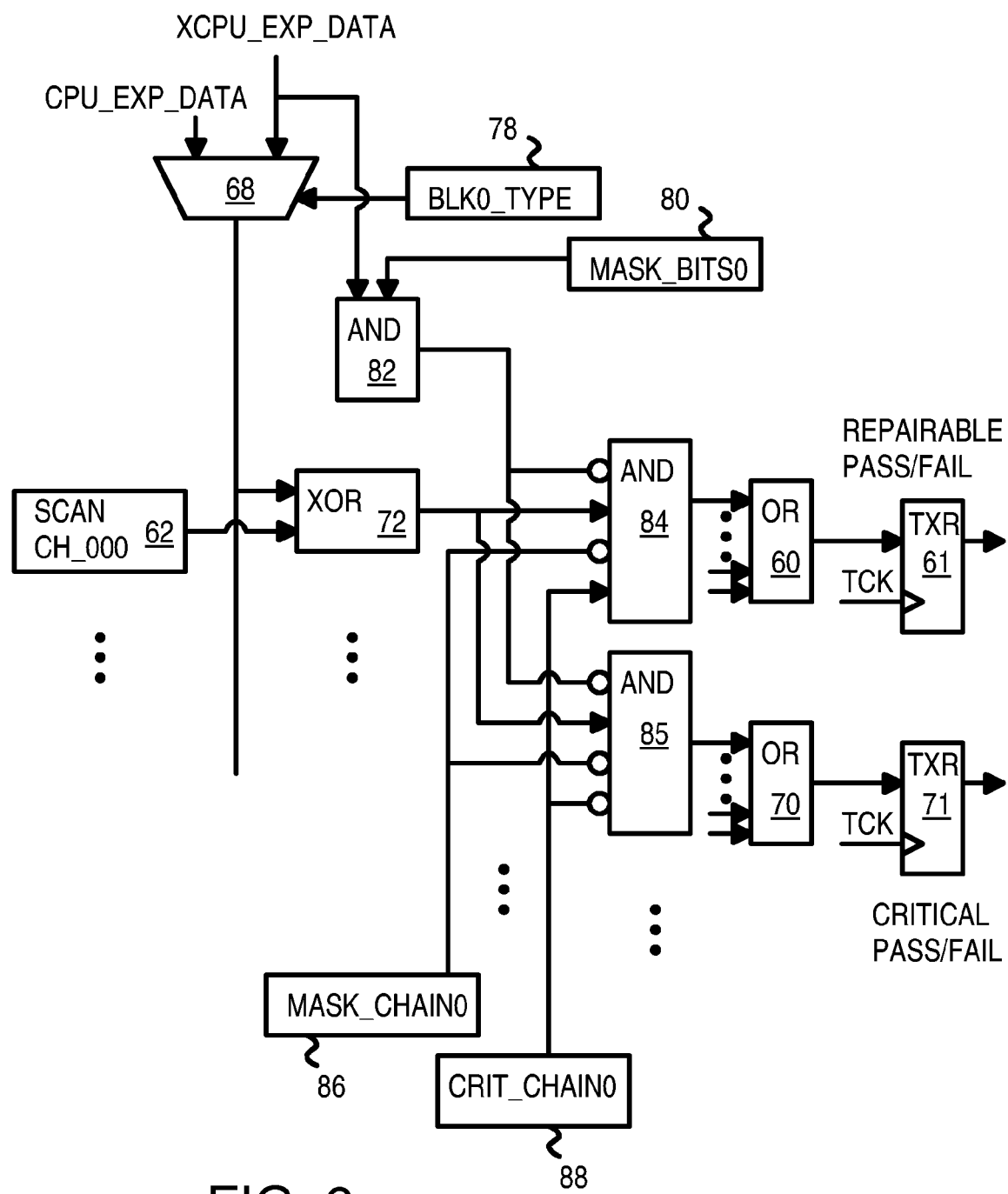
FIG. 9 is a diagram of maskable-bit test verification hardware for use with two different kinds of CPU blocks.

FIG. 9 is a diagram of maskable-bit test verification hardware for use with two different kinds of CPU blocks. It is sometimes desirable to ignore some bits that are scanned out of test scan chains while comparing many other bits scanned out of the same test scan chains. For example, during debugging of new products, some defects may be ignored when the defects occur in logic that is not critical to operation of the CPU block, or for new functions that do not work as intended and are not documented to customers. Yields may be increased by masking out failures in these less-important functions and their corresponding logic.

Mux 68 and block-type register 78 operate as described for FIG. 7, selecting either regular or extended expected data for comparison by XOR gates 72. Each scan chain 62 feeds its scan output to its own XOR gate 72. There may be many scan chains and XOR gates; only one scan chain is shown in the simplified Figure.

An entire scan chain may be ignored by setting a bit in chain mask register 86. Chain mask register 86 drives a one to AND gates 84, 85, which is inverted at the input, forcing AND gates 84, 85 to drive a low to OR gates 60, 70. Thus any compare results from XOR gate 72 is blocked at AND gates 84, 85 and thus ignored or masked.

Critical chain register 88 has bits that select whether the scan chain is a critical or a repairable scan chain. Thus a scan chain may be designated by software to be either critical or repairable. This allows for flexibility during development, since it may later be discovered that some critical failures are not really critical but may be repairable.

When the bit in critical chain register 88 is set, AND gate 84 passes compare results from XOR gate 72 through to OR gate 60, allowing a detected failure to set repairable test-capture register 61. However, the one is inverted at the input to AND gate 85, causing AND gate 85 blocks compare results from OR gate 70 and from setting critical test-capture register 71.

When the bit in critical chain register 88 is low, AND gate 85 inverts the low to a high and passes compare results from XOR gate 72 through to OR gate 70, allowing a detected failure to set critical test-capture register 71. However, the low input to AND gate 84 causes AND gate 84 to block compare results from OR gate 60 and from setting repairable test-capture register 61.

Entire scan chains are designated as critical or repairable by critical chain register 88, and the entire scan chain can be masked by chain mask register 86.

Individual bits in a scan chain may be masked by mask bits register 80 and AND gate 82 for regular CPU blocks, but not for extended CPU blocks. The regular expected data is scanned in from the external tester on CPU_EXP_DATA to mux 68 and on to XOR gates such as XOR gate 72.

Bit-mask data may be scanned in on XCPU_EXP_DATA and applied to AND gate 82. This bit-mask data may change for each test clock period, and thus can mask individual bits in a scan chain, rather than just the whole scan chain. To use this feature, register 78 may be loaded with a 0 to use expected data from CPU_EXP_DATA. XCPU_EXP_DATA is used as mask information. Thus each bit in the scan chain is represented by two bits, value and mask.

When a bit in mask bits register 80 is low, normal comparisons occur as the bit-mask data is blocked by AND gate 82.

When a bit in mask bits register 80 is set, AND gate 82 passes the bit-mask data through to AND gates 84, 85. When the bit-mask data is low, normal comparisons are enabled of test scan data from the scan chains. However, when the bit-mask data is high, comparisons are disabled from setting test-capture registers, since AND gates 84, 85 block their other inputs. Thus individual bits may be masked within a test sequence. AND gate 82 could be many bits in width, allowing separate bit-mask data for each scan chain. Alternately, bit-mask data may be shared among several or all scan chains. Many variations are possible.

Alternate Embodiments

Several other embodiments are contemplated by the inventors. For example test logic may be implemented in a variety of ways. Logic may be synthesized from functional descriptions or logic equations. Rather than use XOR gates, exclusive-NOR (XNOR) gates and inversions may be used. Inversions and buffering may be added in many places. Signal may be active-high or active-low.

Terms such as deep, near, and periphery may refer to logical rather than physical locations. For example, a critical defect might be physically deep within a CPU block, but drive an external signal line, and thus be on the "periphery", or logically near the edge of the CPU block. Automatic test-pattern generator (ATPG) and other tools may be used to create test patterns of data to scan in and expected data for comparison.

The scan chains in a single CPU block could be different lengths. Shorter scan chains pass data through more quickly than longer scan chains, but the expected data may still be compared. Some test-clock periods may have do-not-care expected data. Test data applied to the chip may be replicated by buffering, branching logic with more output nodes than input nodes, or even using a branching wiring trace that is driven by the test data and has several endpoints that all receive the same test data. The endpoints can be inputs to logic gates, buffers, or data inputs of latches, flip-flops, or scan flip-flops. The expected test data could be loaded from the external tester onto the chip using a second test input pin, allowing test data to be shifted into the scan flip-flops while comparison is occurring on data being shifted out, or a single test input pin could be used. Dummy data such as all ones or all zeros could be shifted into the scan flip-flops while the expected data is being transferred to the comparators when a single test input pin is used. Shorter chains may get padded with 0's. The expected values may get padded with either 0's or 1's, depending on the inversion polarity of the scan chain.

Two or more kinds of CPU blocks could be tested at different times using just one set of expected data and without mux 68 of FIGS. 7, 9. When regular CPU blocks are tested, regular expected data is scanned in, and test software ignores results from test-capture registers for extended blocks and only reads test-capture registers for regular CPU blocks. When extended CPU blocks are tested, extended expected data is scanned in, and test software ignores results from test-capture registers for regular blocks and only reads test-capture registers for extended CPU blocks. There may be several other kinds of blocks that are not parallel tested, such as memories, controllers, or a master CPU block. The invention may be applied to a variety of kinds of chips. Snoop tags, CPU's, caches, and other blocks may be replaced with other functional blocks and need not be present on each chip. For example, the invention could be applied to a chip without caches, without snoop tags, and even without general-purpose CPU's. The chip could have specialized blocks that perform a function such as communications processing.

Test functions may be partitioned between an on-chip test controller and an off-chip external tester. Software, firmware, programmable logic, and custom logic may be used in various combinations. Chip "pins" may be leads of various shapes, solder balls, tabs, or other interconnect technology and are not strictly limited to pin-type interconnect that was originally used for chips.

While a test clock separate from a CPU clock has been described, both the test and CPU clocks could be derived from a common clock, or could be merged so that each test flip-flop receives only one clock and has a test-select signal that selects the test input or the normal D input. In that alternative, the one flip-flop clock is the test clock when the select signal is in the test state to select the test input, but the same flip-flop clock is the CPU clock when the select signal is not in the test state. Thus the same physical clock line can act as the test clock during test mode, and also act as the CPU clock during normal operating mode. One physical line then carries two signals—the test clock signal and the CPU clock signal, but at different times.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A parallel-testable multi-block chip comprising:
  a test clock that is pulsed during a test mode;
  an operating clock that is pulsed during the operating mode;
  a test-data input that receives a stream of test input data during the test mode, the test input data being synchronized to the test clock;
  an expected data line that carries expected test data synchronized to the test clock;
  a plurality of functional blocks that are capable of performing functions in parallel at a same time in response to the operating clock, the plurality of functional blocks being testably identical;
  each functional block in the plurality of functional blocks comprising:
  functional logic to perform functions in response to the operating clock;
  scan flip-flops that form a first scan chain that links an output of a prior scan flip-flop to a test input of a next scan flip-flop for all scan flip-flops except for a first scan flip-flop and a final scan flip-flop in the first scan chain, wherein each scan flip-flop also has a data input driven by the functional logic, wherein the data input is clocked to the output of a scan flip-flop when the operating clock is pulsed, while the test input is clocked to the output of the scan flip-flop when the test clock is pulsed;
  wherein outputs of the scan flip-flops are also inputs to the functional logic;
  wherein the first scan flip-flop in the first scan chain has a test input that receives the stream of test input data that is shifted through the first scan chain in response to pulsing of the test clock during the test mode;
  a comparator having an input that receives the output of the final scan flip-flop in the first scan chain and compares the output to expected test data from the expected data line and signals a fault when a mismatch occurs; and
  a test-capture register that is triggered to indicate a fault in the functional block in response to the comparator signaling the fault;
  wherein a plurality of test capture registers for the plurality of functional blocks is readable to determine which of the plurality of functional blocks is a failing functional block having the fault;
  wherein the expected test data matches outputs from the first scan chain in each of the plurality of functional blocks when no defects occur, wherein the plurality of functional blocks are tested with a same expected test data and are testably identical,
  whereby the plurality of functional blocks are tested in parallel using the expected test data that is compared in parallel to outputs of the first scan chains in each of the plurality of functional blocks.

2. The parallel-testable multi-block chip of claim 1 further comprising:
  a test controller that halts pulsing of the test clock after a first phase and pulses the operating clock during a second phase of the test mode to alter test data in the scan flip-flops using the functional logic before resuming pulsing of the test clock during a third phase to shift altered test data through the scan flip-flops to the comparator for comparison to the expected test data;
  wherein the scan flip-flops have a clock input and a test-select input, the test-select input indicating when a clock applied to the clock input is the test clock, and when the clock applied to the clock input is the operating clock, or
  wherein the scan flip-flops have an operating clock input and a test clock input, the test clock input receiving the test clock, and the operating clock input receiving the operating clock,
  whereby test data in the scan flip-flops is altered by the functional logic during the test mode.

3. The parallel-testable multi-block chip of claim 2 further comprising:
  a test input replicator that drives the stream of test input data from the test-data input to the test input of the first scan flip-flop in the first scan chain in each of the plurality of functional blocks,
  whereby test input data is replicated and distributed to the plurality of functional blocks.

4. The parallel-testable multi-block chip of claim 3 wherein the test controller activates the test input replicator to replicate and distribute the stream of test input data during the first phase, and couples the test-data input to the expected data line during the third phase when an external tester drives the expected test data onto the test-data input, whereby the external tester drives to the test-data input the test input data during the first phase, and the expected test data during the third phase.

5. The parallel-testable multi-block chip of claim 3 further comprising:
a second test-data input that receives the expected test data from an external tester and drives the expected test data onto the expected data line,
whereby the expected test data and the stream of test input data are capable of being received from the external tester simultaneously.

6. The parallel-testable multi-block chip of claim 1 wherein each functional block in the plurality of functional blocks further comprises:
a plurality of scan chains formed from the scan flip-flops and receiving test input data at inputs to each of the plurality of scan chains;
a plurality of comparators receiving outputs from the plurality of scan chains and receiving expected test data, each comparator comparing an output of a scan chain to expected test data and signaling a fault when a mismatch occurs;
wherein the test-capture register is triggered to indicate a fault in the functional block in response to a comparator signaling the fault,
whereby each functional block has a plurality of scan chains and performs a plurality of comparisons.

7. The parallel-testable multi-block chip of claim 6 wherein the plurality of scan chains comprise repairable scan chains and at least one critical scan chain in each functional block;
wherein each functional block further comprises:
combining logic that receives fault signals from the plurality of comparators for repairable scan chains to trigger the test-capture register to indicate a repairable fault in the functional block;
a critical test-capture register triggered to indicate a critical fault in the functional block in response to a comparator coupled to the at least one critical scan chain signaling a fault;
wherein the critical fault indicates that the parallel-testable multi-block chip is bad;
wherein the repairable fault indicates that the parallel-testable multi-block chip is repairable by disabling the functional block having the repairable fault,
whereby critical and repairable faults are indicated for each functional block.

8. The parallel-testable multi-block chip of claim 6 wherein functional blocks that are testably identical have at least 90% of logic gates and interconnections that are identical from one functional block to another functional block in the plurality of functional blocks.

9. The parallel-testable multi-block chip of claim 6 wherein the plurality of functional blocks comprise a plurality of first identical blocks that perform an identical first plurality of functions;
wherein the plurality of functional blocks further comprise a second plurality of second identical blocks that perform an extended plurality of functions.

10. The parallel-testable multi-block chip of claim 6 wherein the plurality of functional blocks comprise central processing unit (CPU) cores that execute instructions during the operating mode.

11. The parallel-testable multi-block chip of claim 10 wherein the plurality of functional blocks comprise at least 8 functional blocks that are at least 90% functionally identical.

12. A method for parallel testing of functional blocks on a chip comprising:
activating a parallel test mode for the chip;
receiving scan-in test data from an external tester on a test-input pin of the chip;
simultaneously applying the scan-in test data in parallel to a plurality of scan-chain inputs of scan chains for a plurality of the functional blocks, wherein each test-data bit in the scan-in test data is applied to scan chains for all functional blocks in parallel;
pulsing a functional clock used during a normal mode of the chip when the parallel test mode is not activated, wherein pulsing of the functional clock alters data stored in the scan chains within the functional blocks to generate altered test data;
receiving expected test data from the external tester on a pin of the chip;
replicating the expected test data and simultaneously applying the expected test data in parallel to a plurality of comparators that also receive scan-chain outputs from the scan chains,
shifting the altered test data through the scan chains and to the scan-chain outputs when the expected test data is applied to the plurality of comparators;
wherein each comparator in the plurality of comparators signals a testing fault when the altered test data shifted out of a scan chain does not match the expected test data;
capturing the testing fault in a test-result register that indicates a failing functional block in the plurality of functional blocks that caused the testing fault to be signaled; and
the external tester determining when the test has failed by reading the test-result register,
whereby the functional blocks are tested in parallel by parallel comparison of the altered test data from the scan-chain outputs with the expected test data.

13. The method for parallel testing of functional blocks on a chip of claim 12 further comprising:
disabling the failing functional block to prevent the failing functional block from operating during the normal mode of the chip,
whereby the failing functional block is disabled while passing functional blocks operate in the normal mode of the chip.

14. The method for parallel testing of functional blocks on a chip of claim 12:
wherein the scan chains comprise repairable scan chains coupled to interior logic within a functional block but not connected to other functional blocks;
wherein the scan chains also comprise critical scan chains coupled to interface logic within the functional block, the interface logic being connected to other functional blocks;
wherein capturing the testing fault in a test-result register comprises indicating a critical fault when the testing fault was detected by a comparator receiving altered test data from a critical scan chain;
wherein capturing the testing fault in a test-result register comprises indicating a repairable fault when the testing fault was detected by a comparator receiving altered test data from a repairable scan chain,
whereby critical and repairable scan chains allow indication of critical faults and repairable faults.

15. The method for parallel testing of functional blocks on a chip of claim 14 further comprising:
sorting or marking the chip as a bad chip when the critical fault is indicated;
attempting to repair the chip when the critical fault is not indicated and the repairable fault is indicated;
wherein repair is attempted by disabling the failing functional block to prevent the failing functional block from operating during the normal mode of the chip,
whereby the chip with the critical fault is marked or sorted as the bad chip, while the chip with the repairable fault has repair attempted.

16. The method for parallel testing of functional blocks on a chip of claim 15 further comprising:
sorting or marking the chip as a full-grade chip when the repairable fault is not indicated and the critical fault is not indicated;
sorting or marking the chip as a downgraded chip when the repairable fault is indicated and the critical fault is not indicated and has repair attempted successfully;
wherein the downgraded chip is sold as a downgraded chip with fewer functional blocks enabled that the full-grade chip without the repairable fault or the critical fault.

17. The method for parallel testing of functional blocks on a chip of claim 16 wherein the functional blocks are processor cores that execute instructions during the normal mode and have at least 100,000 transistors per functional block.

18. The method for parallel testing of functional blocks on a chip of claim 12 wherein the scan-in data is serially shifted through each of the scan chains in response to pulsing of a test clock;
wherein shifting the altered test data through the scan chains comprises pulsing the test clock;
wherein receiving expected test data from an external tester on a pin of the chip is synchronized to the test clock;
wherein simultaneously applying the expected test data in parallel to a plurality of comparators is synchronized to the test clock,
whereby the test clock synchronizes data shifting and comparison.

19. A parallel-tested integrated circuit comprising:
a test input that receives test input data from an external tester;
test input distributor means, receiving the test input data, for driving a plurality of test inputs with copies of the test input data;
expected test data distributor means, receiving expected test data, for driving a plurality of expected test data inputs with copies of the expected test data;
a plurality of functional blocks, each having a test input in the plurality of test inputs and each having an expected test data input that receives expected test data;
each functional block in the plurality of functional blocks comprising:
functional logic means, responsive to a functional clock, for performing a function;
first repairable scan chain means, having a plurality of scan flip-flops, receiving a bit of the test input data for each pulse of a test clock, for shifting the test input data through a first chain of the plurality of scan flip-flops to a first output in response to pulsing of the test clock;
first compare means, receiving the first output and a bit of the expected test data from the expected test data input for each pulse of the test clock, for signaling a first fault when a mismatch is detected;
second repairable scan chain means, having a plurality of scan flip-flops, receiving a bit of the test input data for each pulse of the test clock, for shifting the test input data through a second chain of the plurality of scan flip-flops to a second output in response to pulsing of the test clock;
second compare means, receiving the second output and a bit of the expected test data from the expected test data input for each pulse of the test clock, for signaling a second fault when a mismatch is detected;
repairable test-capture means for capturing the first fault from the first compare means and for capturing the second fault from the second compare means, and for reporting a repairable fault for the functional block to the external tester when the first fault or the second fault is captured during a test sequence;
critical scan chain means, having a plurality of scan flip-flops, receiving a bit of the test input data for each pulse of the test clock, for shifting the test input data through a critical chain of the plurality of scan flip-flops to a critical output in response to pulsing of the test clock;
critical compare means, receiving the critical output and a bit of the expected test data from the expected test data input for each pulse of the test clock, for signaling a critical fault when a mismatch is detected; and
critical test-capture means for capturing the critical fault from the critical compare means, and for reporting the critical fault for the functional block to the external tester when the critical fault is captured during the test sequence;
wherein each scan flip-flop comprises a scan flip-flop with a test input driven by the test input data shifted through a scan chain, the test input being clocked to an output of the scan flip-flop in response to the test clock, and having a data input driven by the functional logic means, that is clocked to the output in response to the functional clock, whereby scan chains are tested in parallel for each functional block and report repairable and critical faults.

20. The parallel-tested integrated circuit of claim 19 further comprising:
disable means for disabling functional blocks having the repairable fault when no functional blocks have the critical fault.

21. The parallel-tested integrated circuit of claim 20 further comprising:
chain masking means for programmable blocking all compare results in a test sequence from the first compare means or from the second compare means from triggering the repairable fault.

22. The parallel-tested integrated circuit of claim 20 further comprising:
bit masking means for programmable blocking some bits of compare results for some pulses of the test clock in a test sequence from the first compare means or from the second compare means from triggering the repairable fault.

* * * * *